(12) United States Patent
Okihara

(10) Patent No.: US 7,300,851 B2
(45) Date of Patent: Nov. 27, 2007

(54) METHOD OF FABRICATING A SILICON-ON-INSULATOR DEVICE WITH A CHANNEL STOP

(75) Inventor: Masao Okihara, Tokyo (JP)

(73) Assignee: Oki Electric Industry Co., Ltd., Tokyo (JP)

(*) Notice: Subject to any disclaimer, the term of this patent is extended or adjusted under 35 U.S.C. 154(b) by 126 days.

(21) Appl. No.: 11/331,258

(22) Filed: Jan. 13, 2006

(65) Prior Publication Data
US 2006/0154431 A1 Jul. 13, 2006

Related U.S. Application Data

(62) Division of application No. 10/687,839, filed on Oct. 20, 2003, now Pat. No. 7,112,501.

(51) Int. Cl.
*H01L 21/331* (2006.01)
(52) U.S. Cl. .................. 438/372; 438/373; 438/374
(58) Field of Classification Search ........ 438/372–375, 438/514–519
See application file for complete search history.

(56) References Cited

U.S. PATENT DOCUMENTS 6,670,682 B1 * 12/2003 Mouli ................... 257/385

* cited by examiner

*Primary Examiner*—Dung A. Le
(74) *Attorney, Agent, or Firm*—Rabin & Berdo, P.C.

(57) ABSTRACT

A fabrication process for a silicon-on-insulator (SOI) device includes defining an active region in an 501 substrate, doping the entire active region with an impurity of a given conductive type, masking a main part of the active region, and doping the peripheral parts of the active region at least two additional times with an impurity of the same conductive type, preferably using different doping parameters each time. The additional, doping creates a channel stop in the peripheral parts of the active region, counteracting the tendency of the transistor threshold voltage to be lowered in the peripheral parts of the active region, thereby mitigating or eliminating the unwanted subthreshold hump often found in the transistor operating characteristics of, for example, fully depleted SOI devices.

6 Claims, 5 Drawing Sheets

METHOD OF FABRICATING A SILICON-ON-INSULATOR DEVICE WITH A CHANNEL STOP

CROSS REFERENCE TO RELATED APPLICATION

This is a division of parent application Ser. No. 10/687,839, now U.S. Pat. No. 7,112,501, filed Oct. 20, 2003. The entire disclosure of the parent application is incorporated herein by reference.

BACKGROUND OF THE INVENTION

1. Field of the Invention

The present invention relates to a method of fabricating a silicon-on-insulator device. The invented method is particularly relevant to fully depleted silicon-on-insulator devices.

2. Description of the Related Art

Complementary metal-oxide-semiconductor (CMOS) integrated circuits formed on conventional bulk silicon substrates are unable to provide the combination of high performance and low power consumption needed in advanced personal and mobile communication devices, because as their clock rates are increased to boost their performance, and as their internal dimensions are scaled down to permit higher levels of integration, they dissipate increasing amounts of power. Fully depleted silicon-on-insulator CMOS devices offer a promising solution to this problem.

A silicon-on-insulator (5OI) substrate can be created by implanting oxygen ions into a silicon substrate and annealing the substrate to form a buried oxide layer; transistors and other circuit elements are then formed in the silicon layer (the SOl layer) above the buried oxide. Since the transistors are completely isolated from one another by the buried oxide layer and by overlying field oxide layers, they can be laid out at high density without risk of latch-up. High-speed, low-power operation is possible because the parasitic capacitance of the sources and drains of the transistors is reduced. This is particularly true in a fully depleted (FD) SOI device, in which the SOI layer is thin enough to be inverted or depleted throughout its vertical extent. A fully depleted SOI device has a nearly ideal subthreshold coefficient, enabling the transistor threshold voltage to be reduced by about 0.1 volt, for a given level of subthreshold leakage current, as compared with a transistor formed in a bulk silicon substrate. This feature is especially valuable in devices operating at low power-supply voltages.

Although fully depleted 5OI devices have many advantages, they also have an unwanted feature: a subthreshold hump in the drain current vs. gate voltage operating characteristic, due to the formation of a parasitic channel at the edges of the active regions of transistors. In effect, each transistor is flanked by two parasitic transistors with lower threshold voltages. These parasitic transistors leak unwanted current in the off state. As a result, conventional fully depleted 5OI devices draw more current than expected during standby periods, when the device is powered but is not operating.

This problem is not confined to fully depleted 5OI devices; it can also appear in 5OI devices of the partially depleted type.

SUMMARY OF THE INVENTION

An object of the present invention is to eliminate the subthreshold hump in an Sal device.

The present invention provides a method of fabricating an SOI device. An active region in an 5OI substrate is defined by, for example, local oxidation of silicon, and the entire active region is doped with an impurity of a given conductive type. In addition, the main part of the active region is masked, and the peripheral parts of the active region are further doped at least twice with an impurity of the same conductive type as in the main part.

Different doping parameters are preferably used each time the peripheral parts of the active region are doped. For example, different ion implantation energies may be used to project impurity ions to different depths. Different species of impurity ions may also be used. In particular, some or all of the impurity elements used for the further doping of the peripheral parts of the active region may have a higher atomic number than the impurity with which the entire active region is doped.

The extra impurity introduced into the peripheral parts of the active region functions as a channel stop. The doping parameters and the impurity elements used can be selected to give the channel stop a desired depth profile. The channel stop raises the threshold voltage of the parasitic transistors formed at the edges of the active region, thereby suppressing the subthreshold hump.

DETAILED DESCRIPTION OF THE INVENTION

Figure 1:
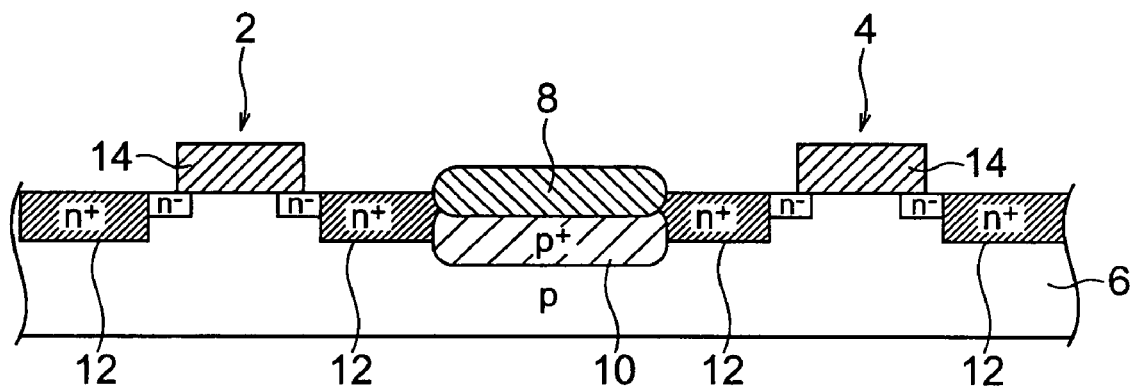
FIG. 1 shows a sectional view of a pair of transistors in a conventional CMOS device with a bulk silicon substrate.

Embodiments of the invention will now be described with reference to the attached drawings. The description will be preceded by a description of the conventional channel stop in a bulk silicon substrate, and of the subthreshold hump iTh a conventional SOI device. Like reference numerals will be used for like parts throughout the drawings.

Referring to FIG. 1, adjacent transistors 2, 4 in a conventional CMOS device having a bulk silicon substrate 6 are mutually isolated from each other by a field oxide 8 formed by local oxidation of silicon (LOCOS) and by a channel stop 10 disposed below the field oxide 8. For n-channel transistors, the substrate 6 is lightly doped and the channel stop 10 is heavily doped with a p-type impurity. The sources and drains 12 of the transistors 2, 4 are heavily doped with an n-type impurity, except for parts extending under the gate electrode 14, which are lightly doped with the n-type impurity.

Figure 2:
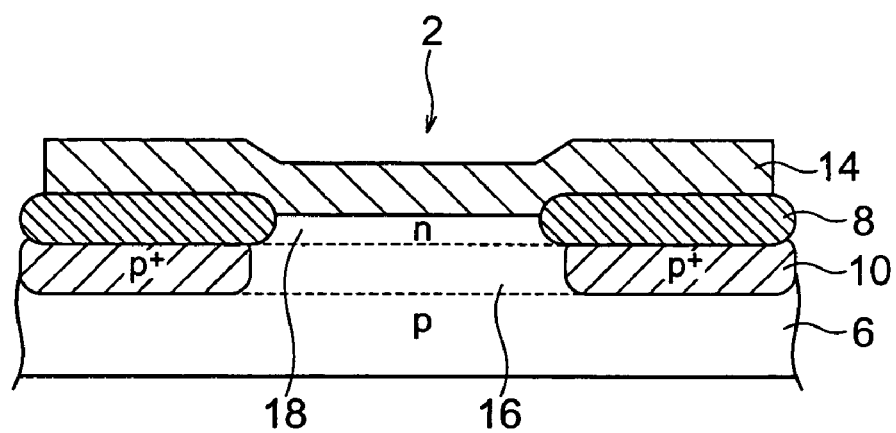
FIG. 2 shows another sectional view of the conventional CMOS device in FIG. 1.

FIG. 2 shows a sectional view through one of the transistors 2 when a positive voltage is applied to the gate electrode 14. The electric field from the gate electrode depletes the substrate 6 of p-type carriers (holes) in a depletion region 16, and n-type carriers (electrons) are drawn from the source (not visible) into the upper part of the depletion region 16 to create an inverted region or n-type channel 18 that conducts current from the drain (not visible) to the source. The direction of current flow in FIG. 2 is perpendicular to the drawing sheet.

The heavily doped channel stop 10 prevents a channel from forming under the field oxide 8, thereby preventing unwanted short circuits between adjacent transistors.

Figure 3:
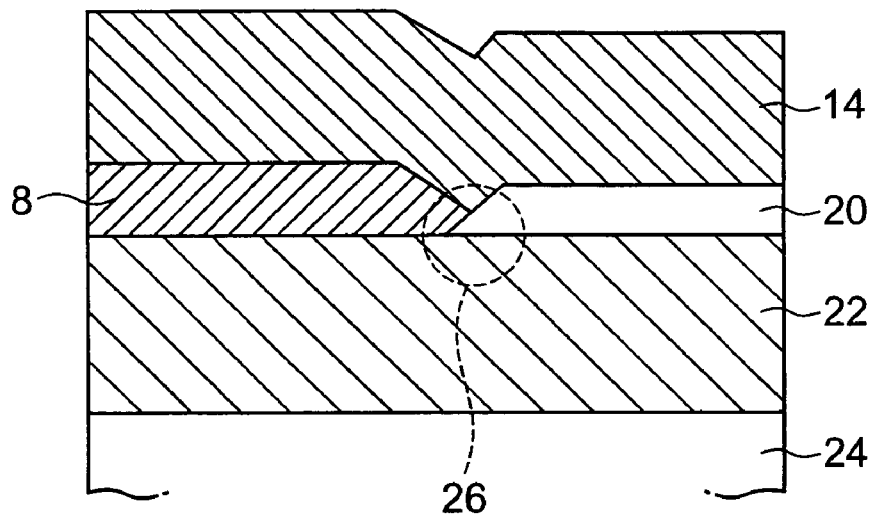
FIG. 3 shows a sectional view of a conventional SOl device.

FIG. 3 shows a conventional fully depleted SOI device in which transistors are formed in an SOI layer 20. For an n-channel transistor, the SOI layer is doped with a p-type impurity such as boron, thus becoming an active region, and n-type source and drain regions (not shown) are formed. The field oxide B and gate electrode 14 are generally similar to the corresponding elements in a bulk device, but the field oxide B and 501 layer 20 both rest on a buried oxide layer 22 formed on a silicon substrate 24. The buried oxide layer 22 obviates the need for a channel stop below the field oxide B.

Where the 501 layer 20 meets the field oxide 8, however, a bird's beak structure is formed, and the 501 layer 20 becomes very thin, as shown in the circled region 26 in the drawing. Given a constant impurity concentration, the amount of impurity present in the thin peripheral part of the 501 layer 20 is much less than the amount present in the main (central) part, so the peripheral part is more easily depleted of p-type carriers than the main part, allowing an n-type channel to form more easily in the peripheral part than in the main part. The threshold voltage in the peripheral part of the 501 layer is therefore lower than the threshold voltage in the main pert. This effect is aggravated by a two-dimensional shape effect that tends to concentrate the electric field from the gate electrode 14 at the periphery of the active region, further lowering the threshold voltage in that area.

Figure 4:
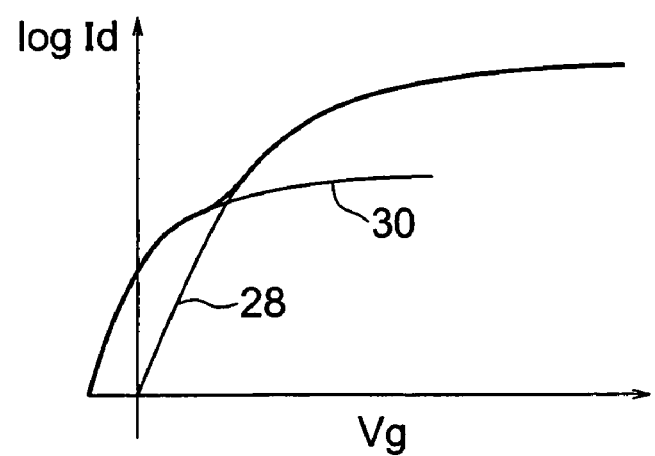
FIG. 4 is a graph schematically illustrating the subthreshold hump in the operating characteristic of the conventional SOI device in FIG. 3.

FIG. 4 plots the operating characteristic of a transistor formed in the 501 layer 20 in FIG. 3 for a fixed source-drain voltage. The horizontal axis indicates the gate voltage Vg (more precisely, the gate-source voltage); the vertical axis indicates the drain current Id on a logarithmic scale. A first curve 28 is shown for the main part of the active region; a second curve 30 is shown for the peripheral part. At zero gate voltage, the main drain current indicated by the first curve 28 substantially disappears, but the peripheral drain current indicated by the second curve 30 does not. The overall operating characteristic of the transistor is given by a sum of these curves 28, 30, and has a humped shape caused by the second curve 30, as generally indicated by the bold line tracing the maximum of the two curves. Due to the hump, an undesirably large amount of drain current continues to flow when the gate voltage Vg is below the threshold voltage in the main region: this subthreshold current flows even when the gate voltage is zero volts. As noted above, the subthreshold hump can be regarded as a parasitic effect of transistors that occupy the peripheral parts of the 801 layer 20, more particularly the parts in which the gate electrode 14 is disposed above the boundary between the 801 layer 20 and the field oxide 8.

Figure 5:
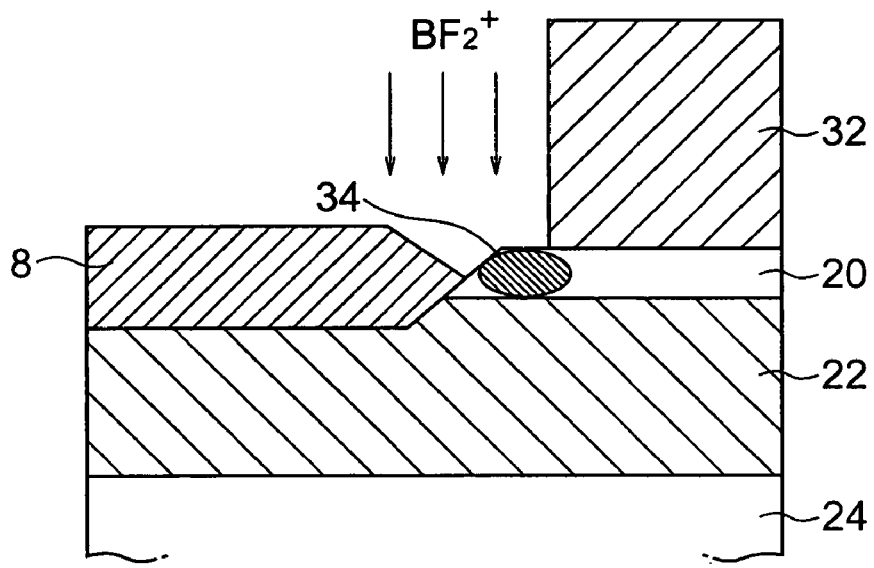
FIGS. 5 and 6 are schematic sectional views illustrating two steps in a first embodiment of the invented fabrication method for an 5OI device.

Referring now to FIG. 5, in a first embodiment of the invention, a buried oxide layer 22 is formed in a silicon substrate 24, leaving an overlying 801 layer 20 with a maximum thickness small enough for the SOI layer to be fully depleted during operation of the 501 device. For example, the maximum thickness of the SOI layer 20 may be substantially sixty nanometers (60 ram). A field oxide 8 is formed by local oxidation of silicon, and a part of the SOI layer surrounded by the field oxide 8 is doped with boron, by implanting boron difluoride (BF2) ions, for example, to create a p-type active region for an n-channel transistor. In the following description, reference numeral 20 will specifically denote this active region.

A mask 32 is formed over the main or central part of the active region 20 by well-known methods such as photolithography and etching, and 3F2 ions are implanted into the peripheral part of the active region 20 at an energy of, for example, fifty kilo-electron volts (50 key). The implanted ions 34 occupy the mid-level part of the periphery of the active region 20, having an average projected range (Rp) of forty nanometers (40 run).

Figure 6:
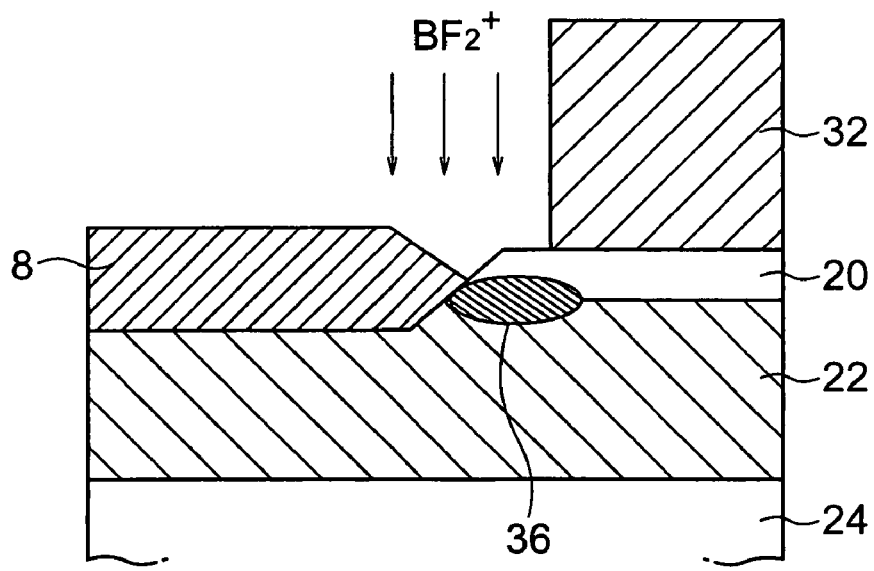

Referring to FIG. 6, the same p-type impurity (BF2) is next implanted into the peripheral part of the active region 20 at a higher energy of, for example, 70 key. The implanted ions 36 occupy the lower-level part of the periphery of the active region 20, having an average projected range of fifty-four nanometers (Rp=54 nm)

The projected range is the distance that an ion penetrates beneath the surface of, in this case, the SOI layer 20. The first embodiment is not limited to the average projected ranges given above, but for a fully depleted SOI device with an 501 layer 60 nm thick, the smaller average projection range (FIG. 5) is preferably at most 30 nm less than the thickness of the SOI layer, and the larger average projection range (FIG. 6) is preferably at most 10 nm less than the thickness of the 501 layer.

Figure 7:
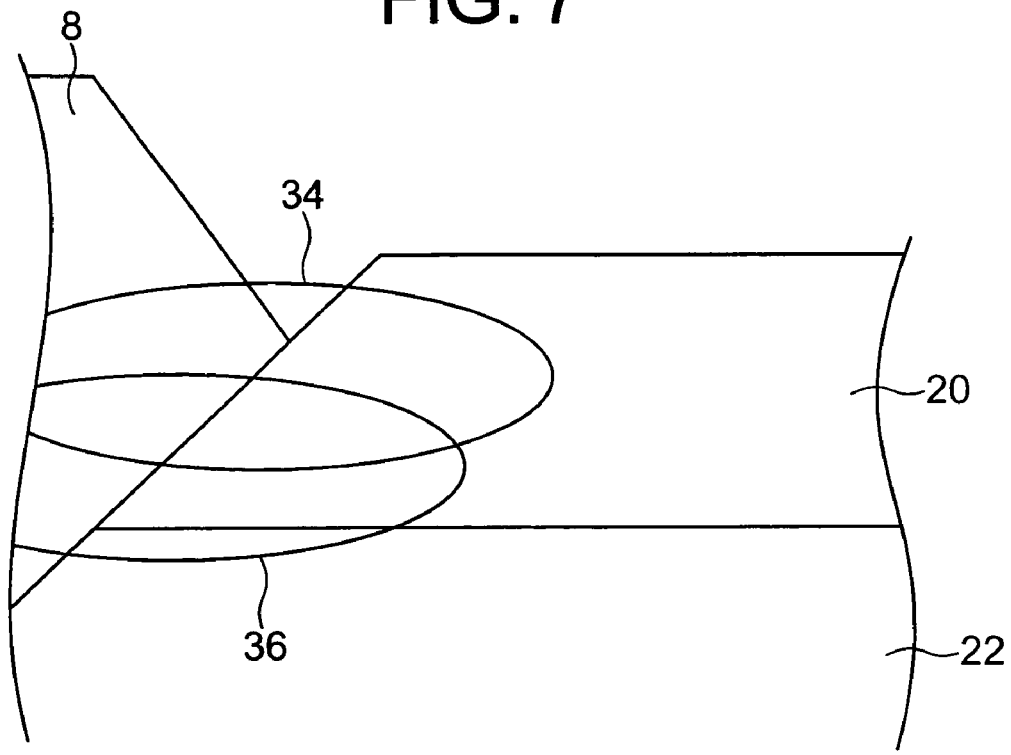
FIG. 7 is a schematic sectional view illustrating the channel stop formed in the first embodiment.
Figure 8:
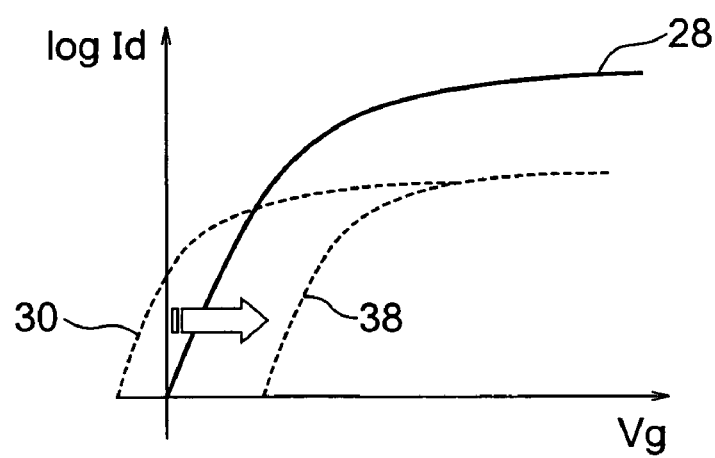
FIG. 8 is a graph schematically illustrating the effect of the first embodiment on the operating characteristic of the 5OI device.

The ion implantation process is followed by an annealing process that activates the implanted ions. Referring to FIG. 7, the two regions of additionally implanted ions 34, 36 overlap in such a way as to ensure that there is an adequate amount of p-type impurity throughout the peripheral part of the active region 20. The effect of the additional implants can be seen in FIG. 8, which plots operating characteristics of an n-channel transistor formed in this active region 20. The main characteristic 28, describing the operation of the transistor in the main part of the active region 20, is the same as in FIG. 4, but the characteristic of the parasitic transistors formed in the edges of the active region 20 is shifted to the right, from curve 30 to curve 38. This is equivalent to a rise in the threshold voltage of the parasitic transistors. The hump indicating unwanted subthreshold current therefore disappears.

The implantation energies given above, and the number of implants, can be varied according to the thickness of the SOl layer. For example, three additional implants with relatively low, medium, and high implantation energies can be used to project additional p-type impurity material into the upper, middle, and lower levels of the peripheral part of the active region.

For a p-channel transistor, the implanted impurity is an n-type impurity such as phosphorus.

Figure 9:
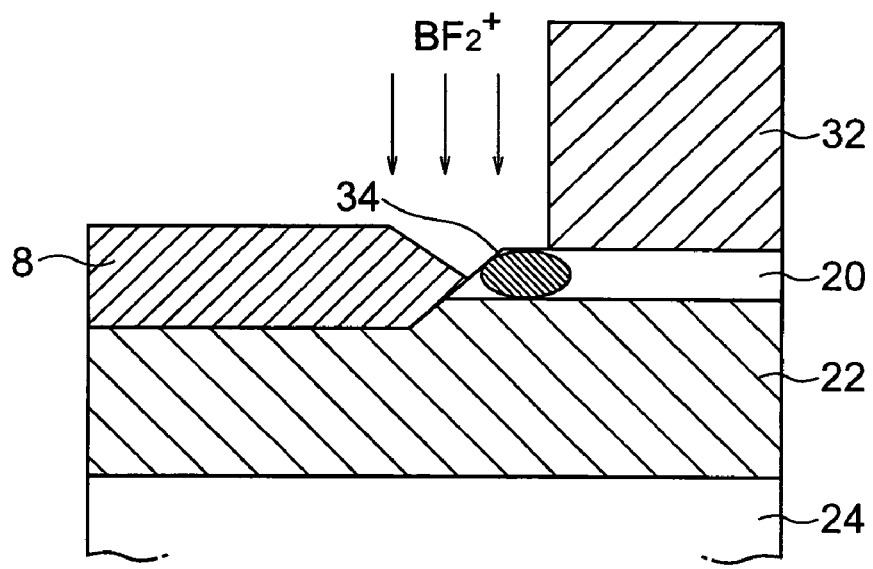
FIGS. 9 and 10 are schematic sectional views illustrating two steps in a second embodiment of the invented fabrication method for an SOI device.

Referring to FIG. 9, a second embodiment begins in the same way as the first embodiment, with the formation of a mask 32 over the main part of a p-type active region 20 and the implantation of additional 3F2 ions 34 into the peripheral part of the active region.

Figure 10:
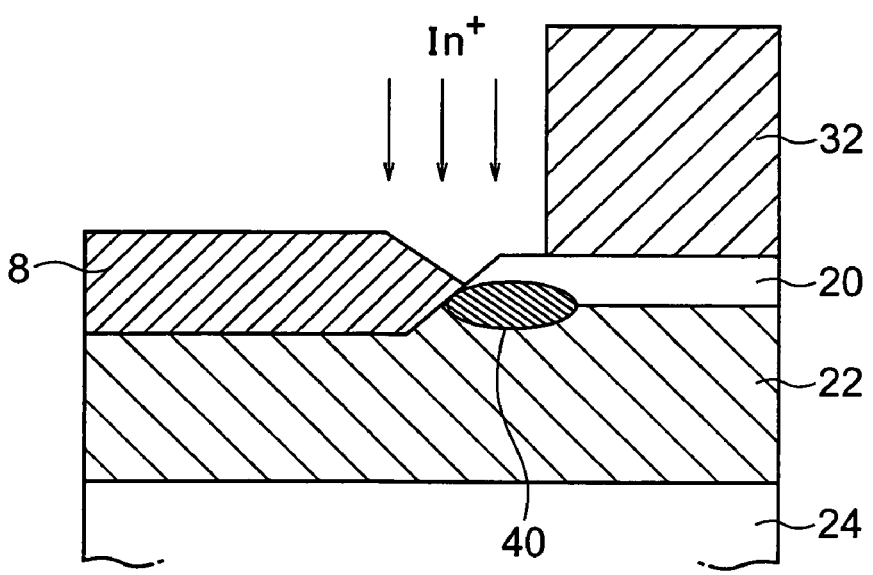

Next, referring to FIG. 10, indium (In) ions are implanted with a higher implantation energy and greater projection range, to place additional p-type impurity material in the lower levels of the active region 20. Indium has a higher atomic number and greater atomic weight than boron. Accordingly, when the device is annealed to activate the implanted impurity, the implanted indium ions 40 will tend to remain in the lower levels of the active region 20, without diffusing into the middle and upper levels or the adjacent field oxide 8 and buried oxide 22. In particular, a high concentration of indium and thus a high p-type carrier concentration can be left in the thinnest part of the active region (the outermost part), where the need to raise the threshold voltage is the greatest.

Use of p-type impurity ions with a comparatively high atomic number can suppress the subthreshold hump in the transistor operating characteristic more completely than in the first embodiment.

The ion implantation steps illustrated in FIGS. 9 and 10 can be performed in either order.

Indium ions can be used for both of the additional implantation steps illustrated in FIGS. 9 and 10.

For a p-channel transistor, a group-V element with a relatively high atomic number, such as antimony, for example, can be used for additional ion implantation into the peripheral part, or the lower peripheral part, of the active region.

The ion implantation steps illustrated in FIGS. 5 and 6, or in FIGS. 9 and 10, may be performed either before or after the main doping of the entire active region 20. The invention is not limited to the impurity elements or ions mentioned above. Any suitable p-type or n-type impurity elements or ions may be used.

The invention is not limited to the use of ion implantation. Impurity elements can be introduced into the active region and/or its peripheral parts by other techniques, such as diffusion techniques.

Although the invention has been described in relation to an active region laterally isolated by a surrounding field oxide of the LOCOS type, the lateral isolation method is not limited to L000S.

The invention is particularly effective in a fully depleted SOI device with a thin 501 layer, but can also be employed in SOI devices of the partially depleted type.

Those skilled in the art will recognize that further variations are possible within the scope of the invention, which is defined in the appended claims.

What is claimed is:

1. A method of forming a silicon-on-insulator device, comprising:
   defining an active region in a silicon-on-insulator substrate;
   doping the entire active region a first time with phosphorus;
   masking a main part of the active region; and
   doping peripheral parts of the active region at least a second time and a third time with phosphorus or antimony at different projection ranges,
   wherein the impurity used is phosphorus the second time and antimony the third time or antimony the second time and phosphorus the third time.

2. The method of claim 1, wherein the peripheral parts of the active region are doped the second and third times by ion implantation.

3. The method of claim 2, wherein mutually different ion implantation energies are used the second time and the third time.

4. The method of claim 2, wherein the peripheral parts of the active region are doped by ion implantation a fourth time in addition to the second time and the third time, mutually different ion implantation energies being used the second, third, and fourth times.

5. The method of claim 1, wherein the silicon-on-insulator substrate is of the fully depleted type.

6. The method of claim 1, wherein defining the active region comprises local oxidation of silicon.

* * * * *